United States Patent
Liou et al.

(10) Patent No.: US 9,288,909 B2
(45) Date of Patent: Mar. 15, 2016

(54) BALL GRID ARRAY PACKAGE SUBSTRATE WITH THROUGH HOLES AND METHOD OF FORMING SAME

(71) Applicant: Marvell World Trade Ltd., St. Michael (BB)

(72) Inventors: Shiann-Ming Liou, Campbell, CA (US); Chenglin Liu, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 21 days.

(21) Appl. No.: 13/756,096

(22) Filed: Jan. 31, 2013

(65) Prior Publication Data

US 2013/0193572 A1    Aug. 1, 2013

Related U.S. Application Data

(60) Provisional application No. 61/593,727, filed on Feb. 1, 2012.

(51) Int. Cl.
| | |
|---|---|
| *H01L 23/04* | (2006.01) |
| *H05K 1/18* | (2006.01) |
| *H05K 3/00* | (2006.01) |
| *H01L 23/14* | (2006.01) |
| *H01L 23/498* | (2006.01) |
| *H05K 3/46* | (2006.01) |
| *H01L 23/31* | (2006.01) |

(52) U.S. Cl.
CPC .............. *H05K 1/181* (2013.01); *H01L 23/145* (2013.01); *H01L 23/49822* (2013.01); *H05K 3/0058* (2013.01); *H01L 23/3128* (2013.01); *H01L 23/49816* (2013.01); *H01L 23/49827* (2013.01); *H01L 2924/0002* (2013.01); *H05K 3/4602* (2013.01); *H05K 2201/10734* (2013.01); *Y10T 29/49117* (2015.01)

(58) Field of Classification Search
USPC .......................................................... 257/698
See application file for complete search history.

(56) References Cited

U.S. PATENT DOCUMENTS

| | | | | |
|---|---|---|---|---|
| 5,994,771 | A * | 11/1999 | Sasaki et al. | 257/700 |
| 7,847,411 | B2 * | 12/2010 | Takaike | 257/777 |
| 8,158,891 | B2 * | 4/2012 | Shih | 174/264 |
| 2011/0024899 | A1 * | 2/2011 | Masumoto et al. | 257/737 |

\* cited by examiner

*Primary Examiner* — Daniel Whalen

(57) ABSTRACT

In accordance with an embodiment, there is provided a substrate of a ball grid array package that includes a first layer including reinforcement fibers. The reinforcement fibers reinforce the first layer such that the first layer has a higher tensile strength relative to a layer in the ball grid array package that is free of reinforcement fibers. In an embodiment, the substrate comprises a second layer disposed adjacent to the first layer with the second layer being free of reinforcement fibers. In an embodiment, the substrate also includes a through hole penetrating each of the first layer and the second layer. The through hole penetrates each of the first layer and the second layer based on each of the first layer and the second layer having been drilled in accordance with a mechanical drilling process.

15 Claims, 4 Drawing Sheets

BALL GRID ARRAY PACKAGE SUBSTRATE WITH THROUGH HOLES AND METHOD OF FORMING SAME

CROSS-REFERENCE TO RELATED APPLICATION

The present disclosure claims priority to U.S. Provisional Patent Application No. 61/593,727, filed on Feb. 1, 2012, which is incorporated herein by reference.

TECHNICAL FIELD

This disclosure relates to package substrates for mounting integrated circuits to a printed circuit board, and more specifically, to ball grid array package substrates with through holes.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuits can be mounted to a printed circuit board using a support structure. The support structure may be referred to as a "package" that electrically couples an integrated circuit to features on the printed circuit board. As the size of integrated circuits decreases and the amount of functionality of integrated circuits increases, package substrates have also decreased in size and include an increased number of connections with the printed circuit board. For example, ball grid array package substrates may cover a smaller footprint on the printed circuit board and provide a higher density of input/output connections between the integrated circuit and the printed circuit board as compared to some other packaging technologies. A ball grid array package substrate couples an integrated circuit to a printed circuit board with a number of solder balls formed on the underside of the package substrate.

SUMMARY

In accordance with an embodiment, a substrate of a ball grid array package includes a first layer having reinforcement fibers. The reinforcement fibers reinforce the first layer such that the first layer has a higher tensile strength relative to a layer in the ball grid array package that is free of reinforcement fibers. The substrate also includes a second layer disposed adjacent to the core layer. The second layer is free of reinforcement fibers. In addition, the substrate includes one or more through holes penetrating each of the first layer and the second layer. The through hole penetrates each of the first layer and the second layer based on each of the first layer and the second layer having been drilled in accordance with a mechanical drilling process.

Additionally, in accordance with an embodiment, an apparatus includes a printed circuit board and a package assembly attached to the printed circuit board. The package assembly includes a package substrate and an integrated circuit attached to the package substrate. The package substrate includes a first layer and a second layer. The first layer includes reinforcement fibers that reinforce the first layer such that the first layer has a higher tensile strength relative to a layer in the package substrate that is free of reinforcement fibers. The second layer includes a first surface disposed adjacent to the first layer and a second surface substantially parallel to the first surface. The second surface includes a circuit pattern having a number of lines and at least a portion of the number of lines has a width less than 20 microns. The substrate also includes a through hole penetrating each of the first layer and the second layer. The through hole penetrates each of the first layer and the second layer based on each of the first layer and the second layer having been drilled in accordance with a mechanical drilling process.

Further, in accordance with an embodiment, a method includes providing a first layer having a first planar surface and a second planar surface substantially parallel to the first planar surface. The method also includes forming a package substrate by applying a second layer to the first layer. The first layer includes reinforcement fibers that reinforce the first layer such that the first layer has a higher tensile strength relative to a layer in the package substrate that is free of reinforcement fibers. The second layer is free of a reinforcement material. In addition, the method includes mechanically drilling a number of through holes that penetrate each of the first layer and the second layer. Furthermore, the method includes coupling the package substrate to a printed circuit board.

BRIEF DESCRIPTION OF THE DRAWINGS

Embodiments of the present disclosure will be readily understood by the following detailed description in conjunction with the accompanying drawings. To facilitate this description, like reference numerals designate like elements.

DETAILED DESCRIPTION

Described herein are example systems, components, and methods directed to ball grid array package substrates. The following description merely provides examples and is in no way intended to limit the disclosure, its application, or uses.

Ball grid array package substrates may be used to mount an integrated circuit to a printed circuit board. In some cases, a ball grid array package substrate includes a stack of layers having one or more core layers and a number of build-up layers. In a typical ball grid array package substrate, the core layers and the build-up layers include reinforcement fibers, such as glass fibers, to provide strength to the package substrate. When the build-up layers include reinforcement fibers, forming circuit patterns having features with dimensions (e.g., line width, line spacing) less than 25 microns on the surface of these build-up layers can be problematic. In particular, the surface of these build-up layers is not smooth enough to support the formation of features less than 25 microns. Accordingly, the use of ball grid package substrates may be limited to applications where circuit patterns formed on build-up layers of the package substrates is greater than 25 microns.

Furthermore, some package substrates, such as flip-chip ball grid array package substrates may include build-up layers having dimensions of features of circuit patterns less than 25 microns. However, these flip-chip ball grid array package substrates are not formed with through holes that penetrate each layer of the package substrate to electrically couple circuit patterns (or circuit features) among the various layers of the package substrate. Rather, the flip-chip ball grid array package substrates typically include vias formed by a laser on individual layers of the package substrate that are later combined to provide electrical connections between the layers.

The present disclosure is directed to ball grid array package substrates having layers that can support the formation of circuit patterns with features less than 25 microns and that include through holes that are mechanically drilled through each of the layers of the package substrate. The use of through holes to electrically connect circuit patterns (or circuit features) among the various layers of the package substrate is more efficient and cost effective than the use of laser vias because the layers of the package substrate can be attached to each other, and then the through holes can be drilled as opposed to forming the laser vias in individual layers and then attaching the layers to form the package substrate.

Figure 1:
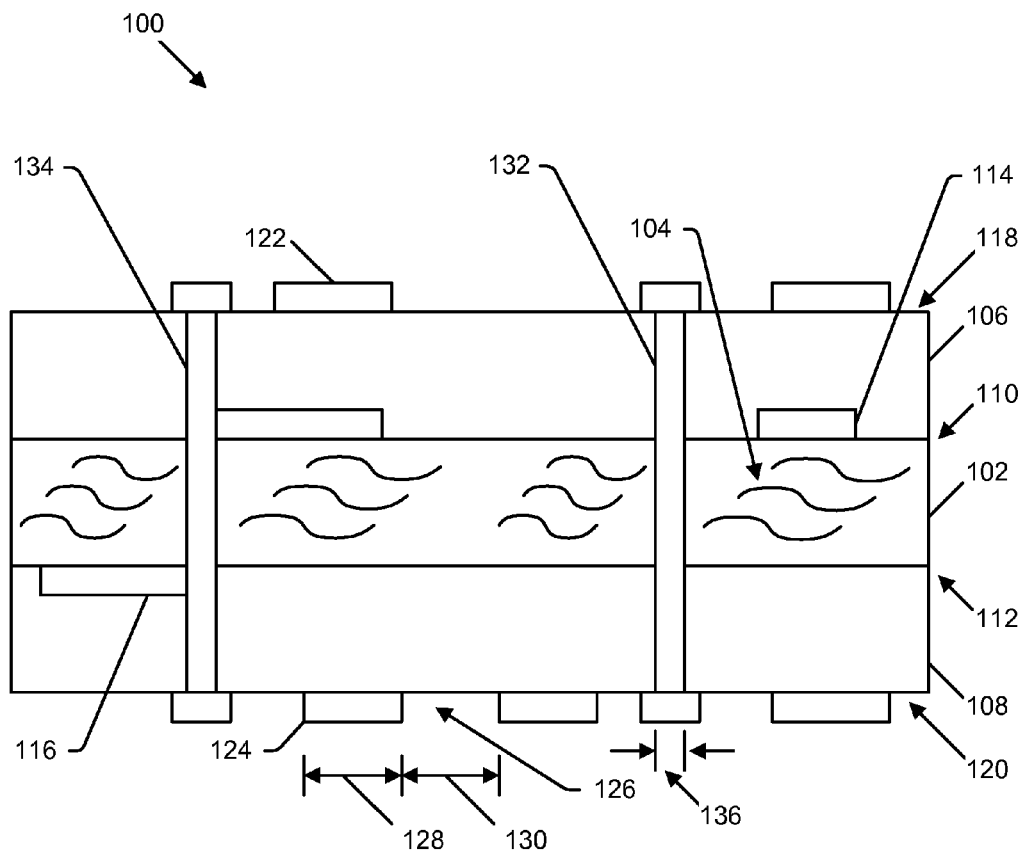
FIG. 1 is a diagram illustrating a cross-sectional view of a package substrate in accordance with an embodiment.

FIG. 1 is a diagram illustrating a cross-sectional view of a substrate 100 of a package assembly in accordance with an embodiment. The package substrate 100 includes a core layer 102. In an embodiment, the core layer 102 includes one or more materials, such as a resin, an epoxy, or a combination thereof. Additionally, the core layer 102 generally includes a number of reinforcement fibers 104. The reinforcement fibers 104 add strength to the core layer 102. In some cases, the reinforcement fibers 104 may include glass fibers and/or cotton fibers. In an embodiment, the core layer 102 has a tensile strength of at least 175 MPa (Megapascal), at least 200 MPa, or at least 250 MPa. In a non-limiting illustrative embodiment, the core layer 102 has a tensile strength within a range of about 150 MPa to about 550 MPa. In another non-limiting illustrative embodiment, the core layer 102 has a tensile strength within a range of 200 MPa to 300 MPa. In a further non-limiting illustrative embodiment, the core layer 102 has a tensile strength within a range of 300 MPa to 350 MPa.

The package substrate 100 also includes a first additional layer 106 and a second additional layer 108. In some cases, the first additional layer 106 and the second additional layer 108 may be referred to herein as "build-up" layers. In an embodiment, the first additional layer 106 and the second additional layer 108 are free of a reinforcement material. The first additional layer 106 and the second additional layer 108 can include a laminate material, an epoxy, a polyester, a resin, or a combination thereof. In one particular embodiment, at least one of the first additional layer 106 or the second additional layer 108 includes an epoxy-phenolic resin material. In another particular embodiment, at least one of the first additional layer 106 or the second additional layer 108 includes a cyanate ester-epoxy resin material. In some cases, at least one of the first additional layer 106 or the second additional layer 108 may include a halogen, while in other instances, at least one of the first additional layer 106 or the second additional layer 108 may be free of halogens.

In an embodiment, the first additional layer 106 and the second additional layer 108 each have a tensile strength that is less than the tensile strength of the core layer 102. In a particular embodiment, at least one of the first additional layer 106 or the second additional layer 108 has a tensile strength no greater than 125 MPa, no greater than 100 MPa, or no greater than 75 MPa. In a non-limiting illustrative embodiment, at least one of the first additional layer 106 or the second additional layer 108 has a tensile strength within a range of 50 MPa to 150 MPa. In another non-limiting illustrative embodiment, at least one of the first additional layer 106 or the second additional layer 108 has a tensile strength within a range of 70 MPa to 120 MPa.

In an embodiment, the core layer 102 includes a first surface 110 and a second surface 112, in which the second surface 112 is substantially parallel to the first surface 110. At least a portion of the first surface 110 of the core layer 102 is disposed adjacent to a surface of the first additional layer 106. In addition, at least a portion of the second surface 112 of the core layer 102 is disposed adjacent to a surface of the second additional layer 108. In some cases, a portion of the first surface 110 may include a circuit pattern with a number of circuit features, such as an example first circuit feature 114. In various embodiments, the circuit pattern includes a number of conductive pathways arranged according to a particular design. The conductive pathways can carry signals, connect to a power source, connect with ground, or a combination thereof. Additionally, in an embodiment, a portion of the second surface 112 includes a circuit pattern with a number of circuit features, such as an example second circuit feature 116. In an illustrative embodiment, the example first circuit feature 114, the example second circuit feature 116, or both are formed from a conductive material, such as copper.

The first additional layer 104 includes a first outer surface 118, and the second additional layer 106 includes a second outer surface 120. In an embodiment, the first outer surface 118 includes a circuit pattern with a number of circuit features, such as an example third circuit feature 122. The second outer surface 120 also includes a circuit pattern with a number of circuit features, such as an example fourth circuit feature 124. In a particular embodiment, the example first circuit feature 114, the example second circuit feature 116, the example third circuit feature 122, the example fourth circuit feature 124, or a combination thereof include a line of a circuit pattern. In some situations, the lines of respective circuit patterns formed on at least one of the first surface 110, the second surface 112, the first outer surface 118, or the second outer surface 120 may have a respective width. In other situations, respective circuit patterns formed on at least one of the first surface 110, the second surface 112, the first outer surface 118, or the second outer surface 120 may have a particular spacing between lines of the respective circuit patterns. For example, in the illustrative embodiment of FIG. 1, the example fourth circuit feature 124 has a width 128 and a spacing 130 between the example fourth circuit feature 124 and an adjacent circuit feature. In some cases, at least a portion of the widths of lines of circuit patterns formed on at least one of the first surface 110, the second surface 112, the first outer surface 118, or the second outer surface 120 may be approximately the same, while in other instances, at least a portion of the widths of lines of circuit patterns formed on the surfaces of layers of the package substrate 100 may be different. Additionally, in some situations, the spacing between at least a portion of the lines of the circuit patterns formed on the surfaces of layers of the package substrate 100 may be approximately the same, while in other scenarios, the spacing between at least a portion of the lines of the circuit patterns formed on the surfaces of layers of the package substrate 100 may be different.

In an illustrative embodiment, lines of circuit patterns formed on surfaces of layers of the package substrate 100 have a width of no greater than 20 microns, no greater than 18 microns, no greater than 15 microns, no greater than 12 microns, or no greater than 10 microns. In a non-limiting illustrative embodiment, line widths of circuit patterns formed on surfaces of the layers of the package substrate 100 are within a range of 6 microns to 25 microns. In another non-limiting illustrative embodiment, line widths of circuit patterns formed on surfaces of layers of the package substrate 100 are within a range of 8 microns to 16 microns. In a further non-limiting illustrative embodiment, line widths of circuit patterns formed on surfaces of layers of the package substrate 100 are within a range of 9 microns to 14 microns.

Additionally, the spacing between lines of circuit patterns formed on the layers of the package substrate 100 is no greater than 20 microns, no greater than 18 microns, no greater than 15 microns, no greater than 12 microns, or no greater than 10 microns. In a non-limiting illustrative embodiment, the spacing between lines of circuit patterns formed on surfaces of the layers of the package substrate 100 is within a range of 6 microns to 25 microns. In another non-limiting illustrative embodiment, the spacing between lines of circuit patterns formed on surfaces of layers of the package substrate 100 is within a range of 8 microns to 16 microns. In a further non-limiting illustrative embodiment, the spacing between lines of circuit patterns formed on surfaces of layers of the package substrate 100 is within a range of 9 microns to 14 microns.

The package substrate 100 also includes a number of through holes, such as example through holes 132, 134. In an embodiment, the through holes 132, 134 of the package substrate 100 penetrate each respective surface of the core layer 102, the first additional layer 106, and the second additional layer 108. In a particular embodiment, the through holes 132, 134 of the package substrate 100 are formed by mechanical drilling. Each of the through holes 132, 134 has a diameter, such as diameter 136 of example through hole 132. In various embodiments, the diameter of the through holes of the package substrate 100 is at least 80 microns, at least 100 microns, at least 125 microns, or at least 150 microns. In a non-limiting illustrative embodiment, the diameter of through holes of the package substrate 100 is within a range of 70 microns to 250 microns. In another non-limiting illustrative embodiment, the diameter of through holes of the package substrate 100 is within a range of 100 microns to 150 microns. In some cases, the diameter of through holes of the package substrate 100 may be substantially uniform over the length of the respective through holes. The length of the through holes of the package substrate 100 is measured in a direction perpendicular to the diameter of the through holes.

In an embodiment, the through holes 132, 134 of the package substrate 100 provide an electrical connection between circuit patterns formed on particular surfaces of the layers of the package substrate 100. In some cases, the through holes 132, 134 of the package substrate 100 may be plated with a plating material. In a non-limiting illustrative embodiment, the plating material includes at least one of copper or gold. Additionally, in some situations, the through holes 132, 134 of the package substrate 100 may be filled, at least in part, with a filler material. In a non-limiting illustrative embodiment, the filler material includes a paste, such as an epoxy-containing paste.

Although the package substrate 100 in the illustrative example of FIG. 1 includes a number of features, the features illustrated in FIG. 1 may, in some instances, represent a portion of the features of the package substrate 100. Thus, the substrate 100 may include additional through holes and/or additional circuit features. In addition, although the package substrate 100 includes a single core layer 102, a package substrate according to other embodiments includes multiple core layers. In one embodiment, the package substrate 100 includes a number core layers stacked together. In one example, the package substrate 100 includes two core layers and in another example, the package substrate 100 includes four core layers. In some cases, each of the number of core layers may include materials similar to those of the core layer 102, while in other situations, the materials of one or more of a number of core layers of the package substrate 100 may include materials different from those of the core layer 102. In one particular embodiment, one or more of a number of core layers of the package substrate 100 includes glass-containing reinforcement fibers. In another particular embodiment, one or more of a number of core layers of the package substrate 100 are free of glass-containing reinforcement fibers.

Furthermore, although two build-up layers (first additional layer 106 and second additional layer 108) are illustrated in FIG. 1, the package substrate 100 may, in some embodiments, include additional build up layers. For example, in one non-limiting illustrative embodiment, the package substrate 100 includes four build-up layers, while in another non-limiting illustrative embodiment, the package substrate 100 includes six build-up layers. In some cases, particular build-up layers of the package substrate 100 may include materials that are similar to the materials of the first additional layer 106 and the second additional layer 108, while in other situations, particular build-up layers may include materials that are different from the materials of the first additional layer 106 and the second additional layer 108. In a particular embodiment, the package substrate 100 includes a build-up layer attached to an integrated circuit and a build-up layer attached to a printed circuit board. In some scenarios, the respective build-up layers attached to the integrated circuit and the printed circuit board may be free from reinforcement fibers, while one or more additional build-up layers may include reinforcement fibers.

Figure 2:
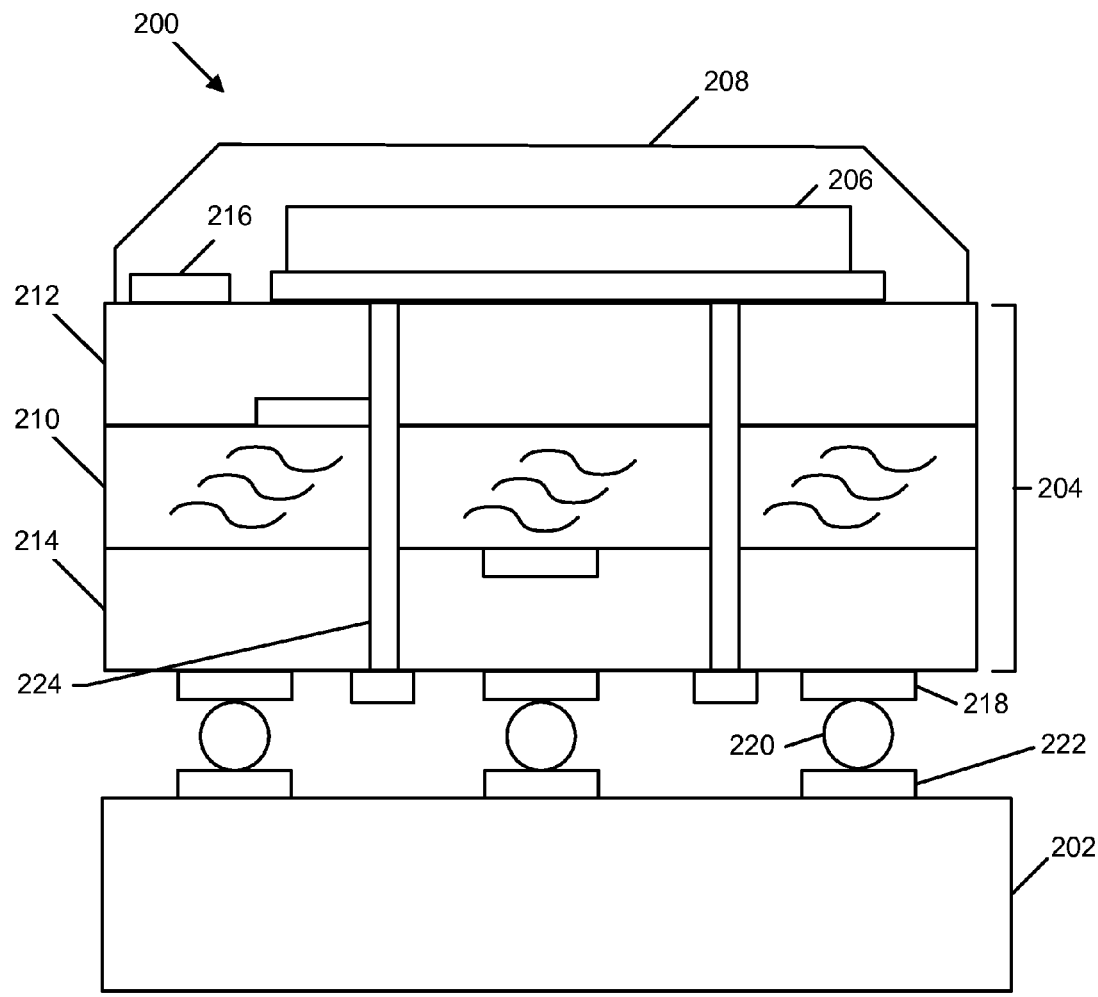
FIG. 2 is a diagram illustrating a cross-sectional view of an apparatus including a package assembly mounted to a printed circuit board in accordance with an embodiment.

FIG. 2 is a diagram illustrating an apparatus 200 including a package assembly mounted to a printed circuit board 202 in accordance with an embodiment. The package assembly includes a package substrate 204 and an integrated circuit 206. The apparatus 200 also includes an encapsulation layer 208 overlying the integrated circuit 206 and at least a portion of the package substrate 204. In an embodiment, the encapsulation layer 208 includes a plastic material. In a particular embodiment, the encapsulation layer 208 includes an epoxy resin. In some cases, the encapsulation layer 208 may contact at least a portion of the integrated circuit 206 and a portion of the package substrate 204.

The package substrate 204 includes one or more core layers, such as core layer 210, and one or more build-up layers, such as first additional layer 212 and second additional layer 214. In an embodiment, the core layer 210 includes reinforcement fibers, while the first additional layer 212 and the second additional layer 214 are free from reinforcement fibers. In a particular embodiment, the package substrate 204 is a ball grid array package substrate. In an illustrative embodiment, the package substrate 204 is the package substrate 100 illustrated in FIG. 1.

In an embodiment, circuit patterns are formed on surfaces of the core layer 210, the first additional layer 212, and the second additional layer 214. In some cases, the circuit patterns may include a number of features, such as lines, bond pads, and the like. For example, an outer surface of the first additional layer 212 includes a first example circuit feature 216 and an outer surface of the second additional layer 214 includes a second example circuit feature 218. In some cases, the integrated circuit 206 may be mounted using features of a circuit pattern on the outer surface of the first additional layer 212. Additionally, in an embodiment, the package substrate 204 is mounted on the printed circuit board 202 via one or more solder balls 220. The solder balls 220 can be coupled to circuit features formed on the outer surface of the second additional layer 216, such as the second example feature 218. The solder balls 220 can also be coupled to circuit features of the printed circuit board 202, such as third example circuit feature 222. In one embodiment, the package substrate 204 is coupled to the printed circuit board 202 with the solder balls 220 using a reflow process.

The package substrate 204 also includes one or more through holes 224. The through holes 224 penetrate each layer of the package substrate 204. In an embodiment, the through holes 224 are formed in the substrate using a mechanical drilling process.

The apparatus 200 can be utilized in a number of applications to provide particular functionality to an electronic device according to the operations performed by the integrated circuit 206. In an embodiment, the electronic device includes a mobile phone, a tablet computing device, a laptop computing device, a desktop computing device, a server computer, an appliance, a media playing device, a gaming device, combinations thereof, and the like. In some cases, the integrated circuit 206 may include an analog integrated circuit, a digital integrated circuit, a mixed signal integrated circuit, or a combination thereof. In one illustrative embodiment, the integrated circuit 206 performs computer processor operations. In another illustrative embodiment, the integrated circuit 206 performs computer memory operations.

Figure 3:
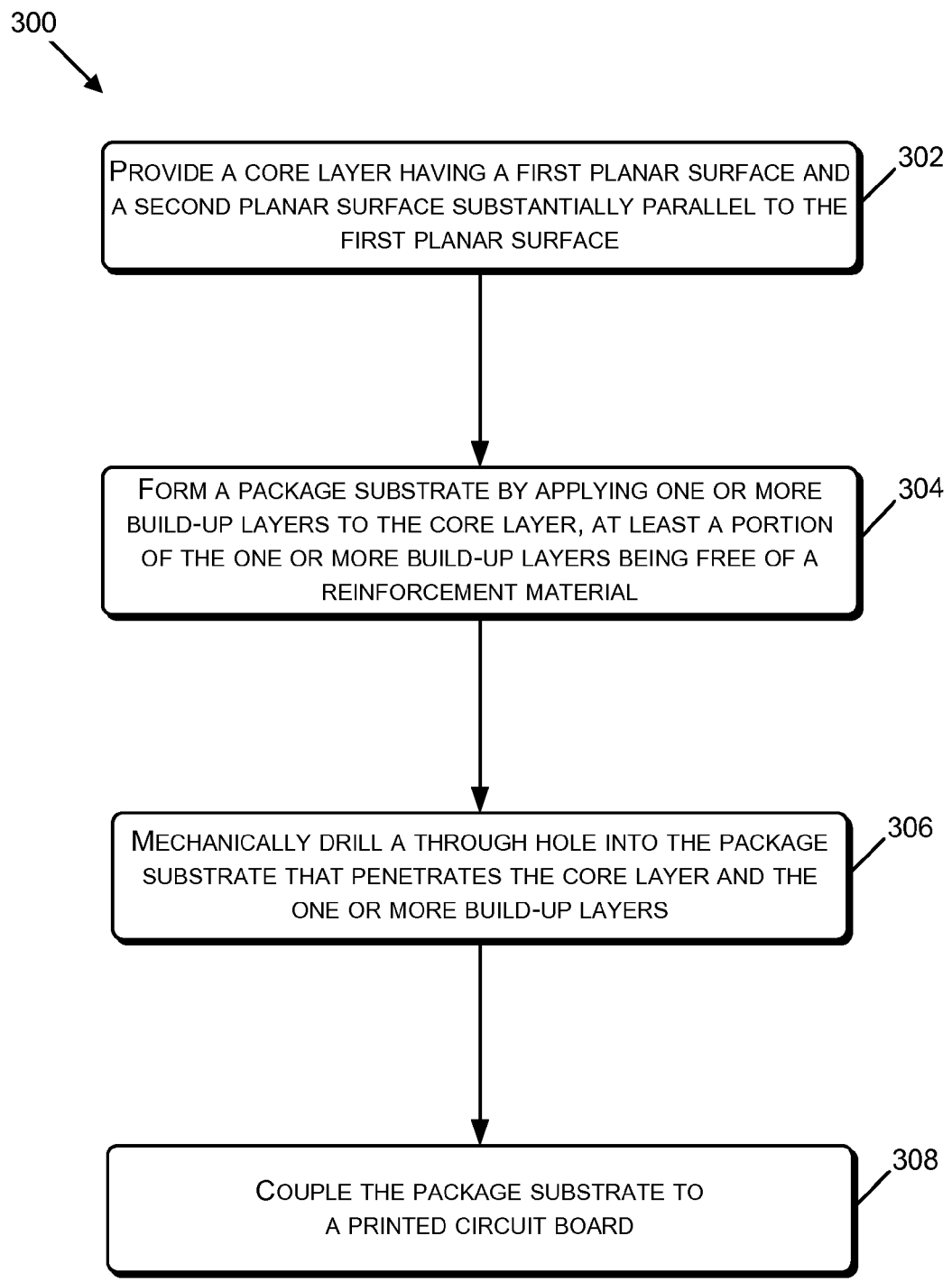
FIG. 3 is a flowchart illustrating an example method of forming a ball grid array package substrate with through holes.

FIG. 3 is a flowchart illustrating an example method 300 of forming a ball grid array substrate with through holes, such as the package substrate 100 of FIG. 1 or the package substrate 204 of FIG. 2. At 302, the method 300 includes providing a core layer having a first planar surface and a second planar surface substantially parallel to the first planar surface. In an embodiment, the core layer includes one or more reinforcement materials that add strength to the core layer. For example, in an embodiment, the core layer includes glass-containing reinforcement fibers. Additionally, in an embodiment, the first planar surface of the core layer, the second planar surface of the core layer, or both includes circuit features. In an illustrative embodiment, the circuit features are formed from copper disposed on the first planar surface, the second planar surface, or both. In some cases, the circuit features are formed using an additive process, a subtractive process, or both. In one embodiment, the circuit features on the first planar surface and/or the second planar surface are formed by etching a material, such as copper, disposed on the first planar surface and/or the second planar surface. In another embodiment, circuit features of the first planar surface and/or the second planar surface are formed using a plating process. In some scenarios, the plating process may be followed by an etching process.

At 304, the method 300 includes forming a package substrate by applying one or more build-up layers to the core layer. In an embodiment, at least a portion of the one or more build-up layers of the package substrate are free of a reinforcing material. In a particular embodiment, the package substrate is formed by applying a first build-up layer to the first planar surface of the core layer and applying a second build-up layer to the second planar surface of the core layer. In some situations, multiple build-up layers may be applied to the first planar surface of the core layer and multiple build-up layers may be applied to the second planar surface of the core layer to form the package substrate.

In an embodiment, surfaces of the one or more build-up layers of the package substrate include one or more features. For example, in some instances, respective circuit patterns may be formed on particular surfaces of the one or more build-up layers. Additionally, in a particular embodiment, features disposed on surfaces of the one or more build-up layers are used to attach the package substrate to an integrated circuit, to a printed circuit board, or both. To illustrate, bond pads disposed on outer surfaces of the one or more build-up layers can couple an integrated circuit and/or a printed circuit board to the package substrate. The features disposed on the surfaces of the one or more build-up layers may be formed by an additive process, a subtractive process, or a combination thereof.

At 306, the method 300 includes mechanically drilling one or more through holes into the package substrate. In an embodiment, the one or more through holes penetrate each layer of the substrate. For example, the one or more through holes penetrate the surfaces of the core layer of the package substrate and the surfaces of each of the build-up layers of the package substrate. Additionally, each of the one or more through holes has a respective diameter. Further, the diameter of the one or more through holes is substantially uniform along the length of each respective through hole. In some cases, the respective diameters of the one or more through holes may be substantially the same, while in other instances, the respective diameters of the one or more through holes may be different. Additionally, in some embodiments, the respective diameters of the one or more through holes depends on the thickness of the layers of the package substrate.

At 308, the method 300 includes coupling the package substrate with a printed circuit board. In one embodiment, the package substrate is attached to the printed circuit board using solder balls of the package substrate. In some cases, the package substrate may be a ball grid array substrate. In a particular embodiment, a reflow process is used to attach the package substrate to the printed circuit board. Additionally, in an embodiment, an integrated circuit is attached to the package substrate with an adhesive material. In some cases, circuit features of the integrated circuit may be coupled to features of a build-up layer of the package substrate that is adjacent to the integrated circuit with respective wires.

Figure 2A:
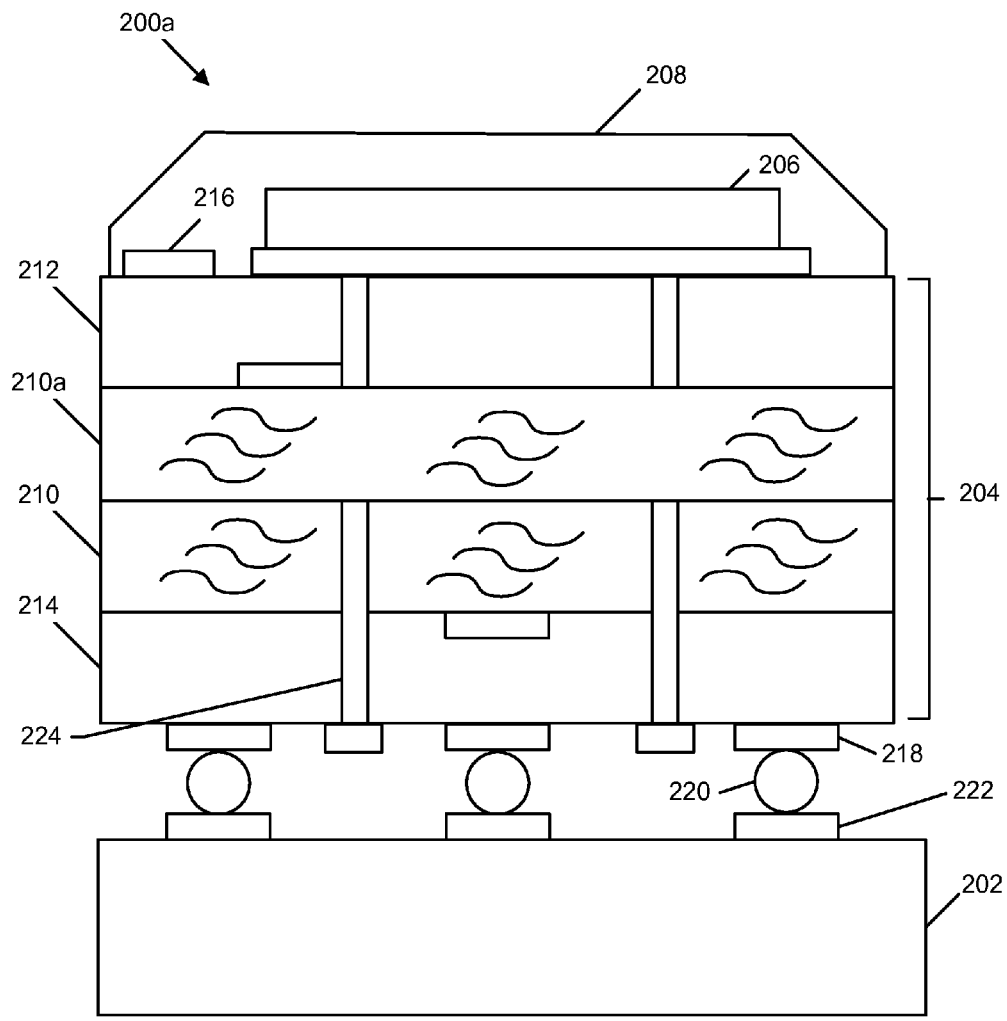
FIG. 2A is a diagram illustrating a cross-sectional view of another apparatus including a package assembly mounted to a printed circuit board in accordance with an embodiment.

Although the example method 300, is described with the package substrate including a single core layer, in other embodiments, the package substrate may include a number of core layers. For example, a package substrate according to an embodiment includes multiple core layers bonded to each other to form a stack of core layers. In some cases, at least one of the core layers may include glass-containing reinforcement fibers. In an additional embodiment, one or more build-up layers are disposed adjacent to a top layer and a bottom layer of the core layer stack. For example, FIG. 2A illustrates an apparatus 200a that is at least in part similar to the apparatus 200 of FIG. 2. However, unlike the apparatus 200 of FIG. 2, the apparatus 200a of FIG. 2A includes an additional core layer 210a (e.g., in addition to the core layer 210). The core layers 210 and 210a, for example, are bonded to each other to form a stack of core layers. In an example, the core layer 210a is similar to the core layer 210, e.g., includes glass-containing reinforcement fibers. In a non-limiting illustrative example, a first core layer includes a first planar surface and a second planar surface and a second core layer includes a third planar surface and a fourth planar surface. In this example, the first planar surface of the first core layer is adjacent to one or more build-up layers and the second planar surface of the first core layer is adjacent to the third planar surface of the second core layer. Furthermore, the fourth planar surface of the second core layer is adjacent to one or more additional build-up layers.

CONCLUSION

Note that the description above incorporates use of the phrases "in an embodiment," or "in various embodiments," or the like, which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This application is intended to cover any adaptations or variations of the embodiments discussed herein. Therefore, it is manifestly intended that embodiments in accordance with the present disclosure be limited only by the claims and the equivalents thereof.

What is claimed is:

1. A substrate of a ball grid array package, the substrate comprising:
    a first layer including reinforcement fibers, wherein the first layer has (i) a first surface and (ii) a second surface substantially parallel to the first surface, and wherein the reinforcement fibers reinforce the first layer such that the first layer has a higher tensile strength relative to a layer in the ball grid array package that is free of reinforcement fibers;
    a second layer disposed adjacent to the first surface of the first layer, wherein the second layer is free of reinforcement fibers;
    a third layer disposed adjacent to the second surface of the first layer, wherein the third layer is free of reinforcement fibers; and
    a through hole penetrating each of the first layer, the second layer, and the third layer.

2. The substrate of claim 1, wherein:
    each of the first layer and the second layer respectively includes a circuit pattern; and
    the through hole permits the circuit pattern of the first layer to be electrically coupled to the circuit pattern of the second layer.

3. The substrate of claim 2, wherein:
    the second layer includes
        (i) an inner surface adjacent to the first surface of the first layer, and
        (ii) an outer surface substantially parallel to the inner surface; and
    the outer surface of the second layer includes a circuit pattern having a number of lines.

4. The substrate of claim 3, wherein at least a portion of the number of lines of the circuit pattern on the outer surface of the second layer have a width of no greater than 20 microns.

5. The substrate of claim 3, wherein a spacing between at least a portion of the number of lines of the circuit pattern on the outer surface of the second layer is no greater than 20 microns.

6. The substrate of claim 1, wherein a diameter of the through hole is at least 80 microns.

7. The substrate of claim 1, wherein a diameter of the through hole is within a range of 100 microns to 150 microns.

8. The substrate of claim 1, wherein a tensile strength of the second layer is no greater than 125 MPa.

9. The substrate of claim 1, wherein a tensile strength of the first layer is at least 250 MPa.

10. The substrate of claim 1, wherein the reinforcement fibers of the first layer comprise a glass-containing material or a cotton-containing material.

11. A substrate of a ball grid array package, the substrate comprising:
    a first layer including reinforcement fibers, wherein the first layer has a first surface and a second surface substantially parallel to the first surface and the reinforcement fibers reinforce the first layer such that the first layer has a higher tensile strength relative to a layer in the ball grid array package that is free of reinforcement fibers;
    a second layer disposed adjacent to the first surface of the first layer, wherein:
        the second layer is free of reinforcement fibers,
        the second layer includes (i) a first surface disposed adjacent to the first surface of the first layer and (ii) a second surface substantially parallel to the first surface,
        the second surface of the second layer includes a circuit pattern having a number of lines, and
        at least a portion of the number of lines have a width less than 20 microns;
    a third layer disposed adjacent to the second surface of the first layer, wherein the third layer is free of reinforcement fibers; and
    a through hole penetrating each of the first layer, the second layer, and the third layer.

12. The substrate of claim 11, wherein the first layer is one of a plurality of core layers of the substrate, each core layer of the plurality of core layers including reinforcement fibers.

13. The substrate of claim 11, wherein at least one of the first layer or the third layer includes a halogen.

14. The substrate of claim 11, wherein the width of the at least a portion of the number of lines is included in a range of 8 microns to 16 microns.

15. The substrate of claim 11, wherein a spacing between adjacent lines of the number of lines is no greater than 20 microns.

* * * * *